United States Patent
Udayakumar et al.

(10) Patent No.: US 8,053,252 B2
(45) Date of Patent: Nov. 8, 2011

(54) MITIGATION OF EDGE DEGRADATION IN FERROELECTRIC MEMORY DEVICES THROUGH PLASMA ETCH CLEAN

(75) Inventors: Kezhakkedath R. Udayakumar, Dallas, TX (US); Lindsey H. Hall, Plano, TX (US); Francis G. Celii, Dallas, TX (US); Scott R. Summerfelt, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/502,571

(22) Filed: Jul. 14, 2009

(65) Prior Publication Data

US 2009/0275148 A1 Nov. 5, 2009

(51) Int. Cl.
*H01L 47/00* (2006.01)

(52) U.S. Cl. ............. 438/3; 438/14; 438/257; 257/303; 257/310

(58) Field of Classification Search .................. 438/3, 4, 438/14, 257, 396; 257/303, 310
See application file for complete search history.

(56) References Cited

U.S. PATENT DOCUMENTS

| | | | |
|---|---|---|---|
| 6,295,195 B1 * | 9/2001 | Maejima | 361/301.3 |
| 6,429,107 B2 * | 8/2002 | Kim et al. | 438/586 |
| 6,534,809 B2 | 3/2003 | Moise et al. | |
| 7,217,576 B2 * | 5/2007 | Nakayama et al. | 438/3 |
| 7,381,344 B1 * | 6/2008 | Chin et al. | 216/67 |
| 2001/0034106 A1 | 10/2001 | Moise et al. | |
| 2004/0157459 A1 * | 8/2004 | Ying et al. | 438/706 |
| 2004/0237998 A1 | 12/2004 | Hall et al. | |
| 2005/0045590 A1 | 3/2005 | Hall et al. | |

* cited by examiner

*Primary Examiner* — Phuc Dang
(74) *Attorney, Agent, or Firm* — Jacqueline J. Garner; Wade J. Brady, III; Frederick J. Telecky, Jr.

(57) ABSTRACT

A ferroelectric memory device is fabricated while mitigating edge degradation. A bottom electrode is formed over one or more semiconductor layers. A ferroelectric layer is formed over the bottom electrode. A top electrode is formed over the ferroelectric layer. The top electrode, the ferroelectric layer, and the bottom electrode are patterned or etched. A dry clean is performed that mitigates edge degradation. A wet etch/clean is then performed.

7 Claims, 5 Drawing Sheets

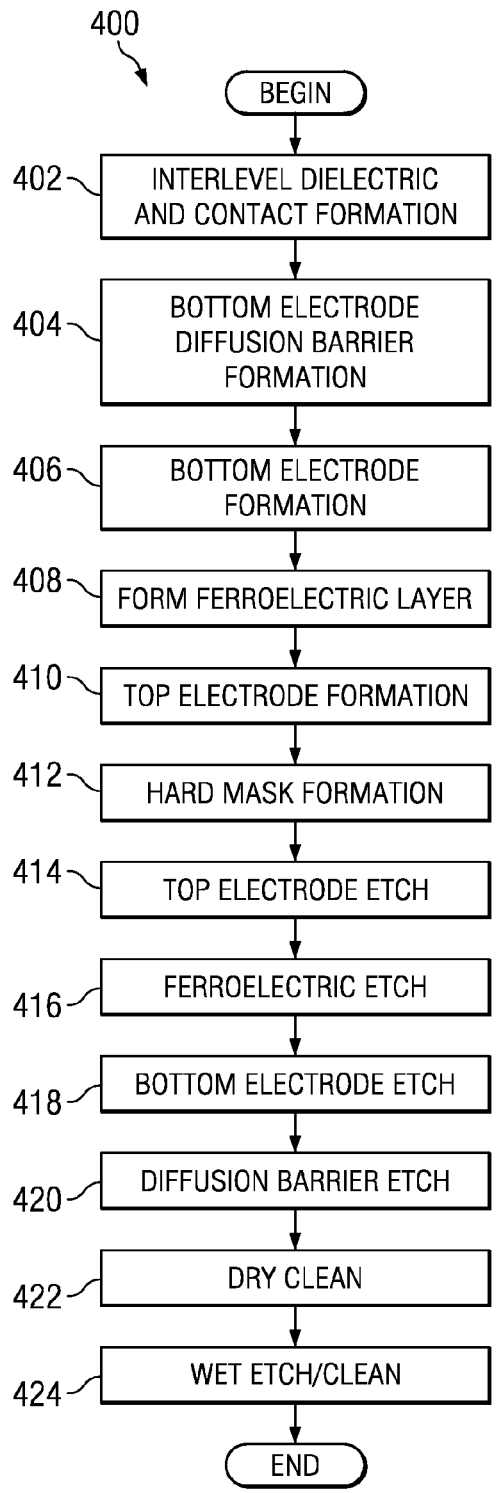
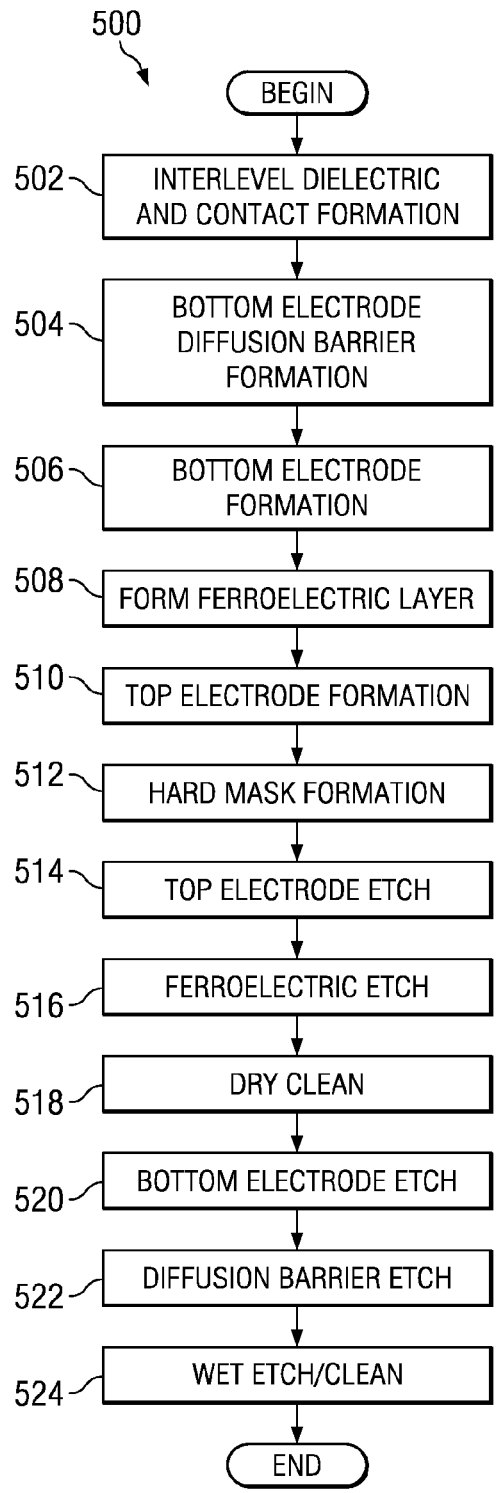
FIG. 4
FIG. 5

MITIGATION OF EDGE DEGRADATION IN FERROELECTRIC MEMORY DEVICES THROUGH PLASMA ETCH CLEAN

The patent application claims priority from U.S. patent application Ser. No. 11/442,810, filed May 30, 2006, U.S. Pat. No. 7,572,698, the entireties of which are incorporated herein by reference.

FIELD OF THE INVENTION

The present invention relates generally to the field of integrated circuit processing, and more particularly, to fabrication of ferroelectric memory devices employing a dry clean to mitigate edge degradation.

BACKGROUND OF THE INVENTION

Several trends exist, today, in the semiconductor device fabrication industry and the electronics industry. Devices are continuously getting smaller and smaller and requiring less and less power. A reason for this is that more personal devices are being fabricated which are very small and portable, thereby relying on a small battery as its supply source. For example, cellular phones, personal computing devices, and personal sound systems are devices which are in great demand in the consumer market. In addition to being smaller and more portable, personal devices are requiring more computational power and on-chip memory. In light of all these trends, there is a need in the industry to provide a computational device which has a fair amount of memory and logic functions integrated onto the same semiconductor chip. Preferably, this memory will be configured such that if the battery dies, the contents of the memory will be retained. Such a memory device which retains its contents while a signal is not continuously applied to it is called a non-volatile memory. Examples of conventional non-volatile memory include: electrically erasable, programmable read only memory ("EEPROM") and FLASH EEPROM.

A ferroelectric memory (FeRAM) is a non-volatile memory which utilizes a ferroelectric material, such as SBT or PZT, as the capacitor dielectric situated between a bottom electrode and a top electrode. Both read and write operations are performed for a FeRAM. The memory size and memory architecture affect the read and write access times of a FeRAM.

The non-volatility of an FeRAM is due to the bi-stable characteristic of the ferroelectric memory cell. One type of FeRAM is a single capacitor memory cell (referred to as a 1T/1C or 1C memory cell), which may require less silicon area (thereby increasing the potential density of the memory array), but can be less immune to noise and process variations. Additionally, a 1C cell requires a voltage reference for determining a stored memory state. Another type of FeRAM is a dual capacitor memory cell (referred to as a 2T/2C or 2C memory cell), which typically requires more silicon area, and it stores complementary signals allowing differential sampling of the stored information.

As illustrated in prior art FIG. 1, a 1T/1C FeRAM cell 10 includes one transistor 12 and one ferroelectric storage capacitor 14. A bottom electrode of the storage capacitor 14 is connected to a drain terminal 15 of the transistor 12. The 1T/1C cell 10 is read from by applying a signal to the gate 16 of the transistor (word line WL) (e.g., the Y signal), thereby connecting the bottom electrode of the capacitor 14 to the source of the transistor (the bit line BL) 18. A pulse signal is then applied to the top electrode contact (the plate line or drive line DL) 20. The potential on the bit line 18 of the transistor 12 is, therefore, the capacitor charge divided by the bit line capacitance. Since the capacitor charge is dependent upon the bi-stable polarization state of the ferroelectric material, the bit line potential can have two distinct values. A sense amplifier (not shown) is connected to the bit line 18 and detects the voltage associated with a logic value of either 1 or 0. Frequently the sense amplifier reference voltage is a ferroelectric or non-ferroelectric capacitor connected to another bit line that is not being read. In this manner, the memory cell data is retrieved.

A characteristic of the shown ferroelectric memory cell is that a read operation is destructive. The data in a memory cell is then rewritten back to the memory cell after the read operation is completed. If the polarization of the ferroelectric is switched, the read operation is destructive and the sense amplifier must rewrite (onto that cell) the correct polarization value as the bit just read from the cell. This is similar to the operation of a DRAM. The one difference from a DRAM is that a ferroelectric memory cell will retain its state until it is interrogated, thereby eliminating the need of refresh.

As illustrated, for example, in prior art FIG. 2, a 2T/2C memory cell 30 in a memory array couples to a bit line 32 and an inverse of the bit line ("bit line-bar") 34 that is common to many other memory types (for example, static random access memories). Memory cells of a memory block are formed in memory rows and memory columns. The dual capacitor ferroelectric memory cell comprises two transistors 36 and 38 and two ferroelectric capacitors 40 and 42, respectively. The first transistor 36 couples between the bit line 32 and a first capacitor 40, and the second transistor 38 couples between the bit line-bar 34 and the second capacitor 42. The first and second capacitors 40 and 42 have a common terminal or plate (the drive line DL) 44 to which a signal is applied for polarizing the capacitors.

In a write operation, the first and second transistors 36 and 38 of the dual capacitor ferroelectric memory cell 30 are enabled (e.g., via their respective word line 46) to couple the capacitors 40 and 42 to the complementary logic levels on the bit line 32 and the bar-bar line 34 corresponding to a logic state to be stored in memory. The common terminal 44 of the capacitors is pulsed during a write operation to polarize the dual capacitor memory cell 30 to one of the two logic states.

In a read operation, the first and second transistors 36 and 38 of the dual capacitor memory cell 30 are enabled via the word line 46 to couple the information stored on the first and second capacitors 40 and 42 to the bar 32 and the bit line-bar line 34, respectively. A differential signal (not shown) is thus generated across the bit line 32 and the bit line-bar line 34 by the dual capacitor memory cell 30. The differential signal is sensed by a sense amplifier (not shown) that provides a signal corresponding to the logic level stored in memory.

One problem encountered by ferroelectric memory is signal degradation during read and write operations. The signal degradation can result in sense amplifiers being unable to determine storage states for affected ferroelectric memory cells. As a result, such ferroelectric memory cells can become unusable.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

Aspects of the present invention facilitate ferroelectric memory device operation and fabrication by mitigating edge degradation of ferroelectric memory cells, which can result in signal degradation, reduced polarization, and/or failure. Aspects of the present invention employ a plasma based dry clean during and/or after ferroelectric stack etching, which can mitigate edge defects and performance degradation of fabricated ferroelectric memory cells.

In accordance with an aspect of the invention, a method of forming a ferroelectric memory device is disclosed. A bottom electrode diffusion barrier layer is formed over one or more semiconductor layers, such as an interlevel dielectric layer. A bottom electrode layer is then formed over the bottom electrode diffusion barrier layer. A ferroelectric layer is formed over the bottom electrode. A top electrode is formed over the ferroelectric layer. The top electrode, the ferroelectric layer, and the bottom electrode are patterned or etched. A dry clean is performed that mitigates edge degradation. The dry clean can remove debris and form residual compounds for later removal. A wet etch/clean is then performed that can remove the residual compounds.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 4 is a flow diagram illustrating a method of fabricating a ferroelectric memory device in accordance with an aspect of the present invention.

FIG. 5 is a flow diagram illustrating a method of fabricating a ferroelectric memory device in accordance with an aspect of the present invention.

DETAILED DESCRIPTION OF THE INVENTION

The present invention will now be described with respect to the accompanying drawings in which like numbered elements represent like parts. The figures provided herewith and the accompanying description of the figures is merely provided for illustrative purposes. One of ordinary skill in the art should realize, based on the instant description, other implementations and methods for fabricating the devices and structures illustrated in the figures and in the following description.

Aspects of the present invention facilitate ferroelectric memory device operation and fabrication by mitigating edge degradation of ferroelectric memory cells, which can result in signal degradation, reduced polarization, and/or failure. Aspects of the present invention employ a plasma based dry clean during and/or after ferroelectric stack etching, which can mitigate edge defects and performance degradation of fabricated ferroelectric memory cells.

Figure 1:
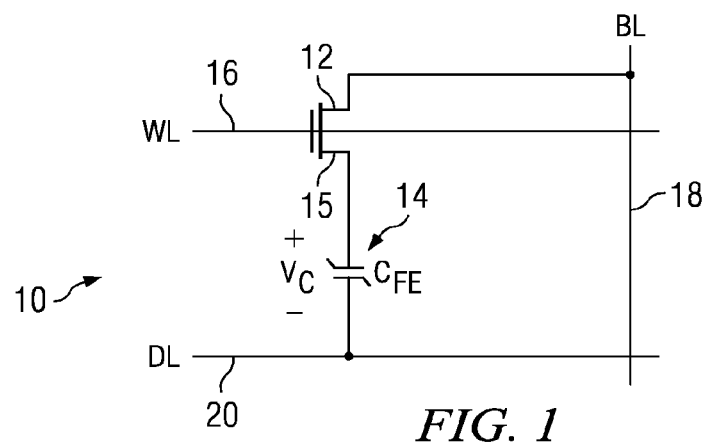
FIG. 1 is a prior art schematic diagram illustrating an exemplary 1T/1C FeRAM memory cell.
Figure 2:
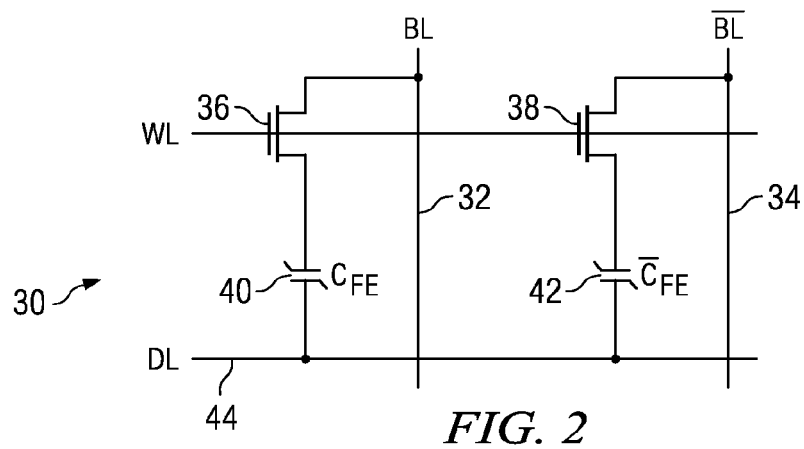
FIG. 2 is a prior schematic diagram illustrating an exemplary 2T/2C FeRAM memory cell.
Figure 3A:
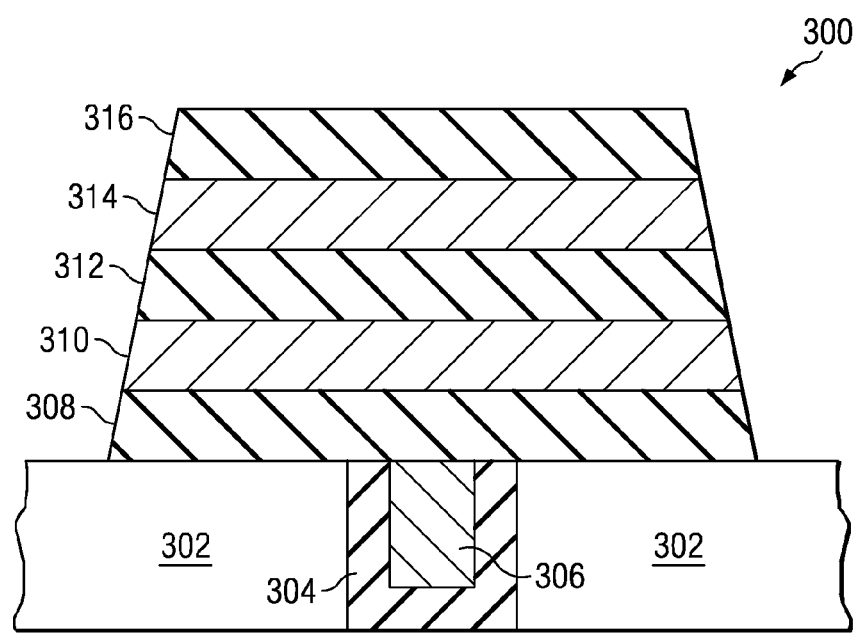
FIG. 3A is a cross sectional view of a ferroelectric memory device after etching of a ferroelectric stack.

FIG. 3A is a cross sectional view of a ferroelectric memory device 300 after etching of a ferroelectric stack. The device 300 is provided for illustrative purposes and is provided as an example.

The device 300 includes one or more semiconductor layers 302 along with a wordline 306 formed therein. The semiconductor layers 302 can include a semiconductor substrate or body and/or interlayer dielectric layers. In one example, the layers 302 are comprised of silicon dioxide. However, other compositions of the layers 302 are possible.

A barrier layer or metal 304 surrounds the wordline 306 and can, for example, facilitate contact resistance, adhesion, and the like. The wordline 306 is comprised of a conductive material, such as tungsten (W).

A bottom electrode diffusion barrier 308 is located over the layers 302 and a bottom electrode 310 is located on the bottom electrode diffusion barrier 308. The bottom electrode 310 is comprised of conductive material, such as a noble metal, for example, iridium (Ir). The diffusion barrier 308 is present to mitigate diffusion of materials, such as dopants, from underlying layers into the bottom electrode 310.

A ferroelectric layer 312 is located on the bottom electrode 310. The ferroelectric layer 312 is comprised of a ferroelectric material, such as $Pb(Zr,Ti)O_3$ PZT (lead zirconate titanate), doped PZT with donors (Nb, La, Ta) acceptors (Mn, Co, Fe, Ni, Al) and/or both, PZT doped and alloyed with $SrTiO3$, $BaTiO3$ or $CaTiO3$, strontium bismuth tantalate (SBT) and other layered perovskites such as strontium bismuth niobate tantalate (SBNT) or bismuth titanate, $BaTiO3$, $PbTiO3$, $Bi2TiO3$ etc.

A top electrode 314 is located on the ferroelectric layer 312. The top electrode 314 is comprised of a conductive material, such as, for example, iridium (Ir), iridium oxide ($IrO_2$), and the like. A hardmask 316 is located on the top electrode and facilitates etching of the ferroelectric stack, which comprises the top electrode 314, the ferroelectric layer 312, the bottom electrode 310, and the bottom electrode diffusion barrier 308.

As an example, the device 300 can be read by applying a signal to the bottom electrode 310 and a pulse to the top electrode 314, and then sensing or measuring charge to determine a polarization state of the device.

However, the inventors of the present invention note that defects, contamination, degradation, and the like due to fabrication process(es) can degrade the performance of the ferroelectric. The degraded performance can lead to device failures, reduced operational lifetimes, loss of data integrity, slower performance, and the like.

For example, separation voltages between polarization states ("0" and "1") can decrease below allowable levels. Outer ferroelectric cells of ferroelectric memory arrays can be particularly susceptible to such separation voltage shrinking. As a result, outer edge cells of an array can have lower separation voltages lower than other cells within the array. This can be problematic for reading and writing from and to cells of the array.

Figure 3B:
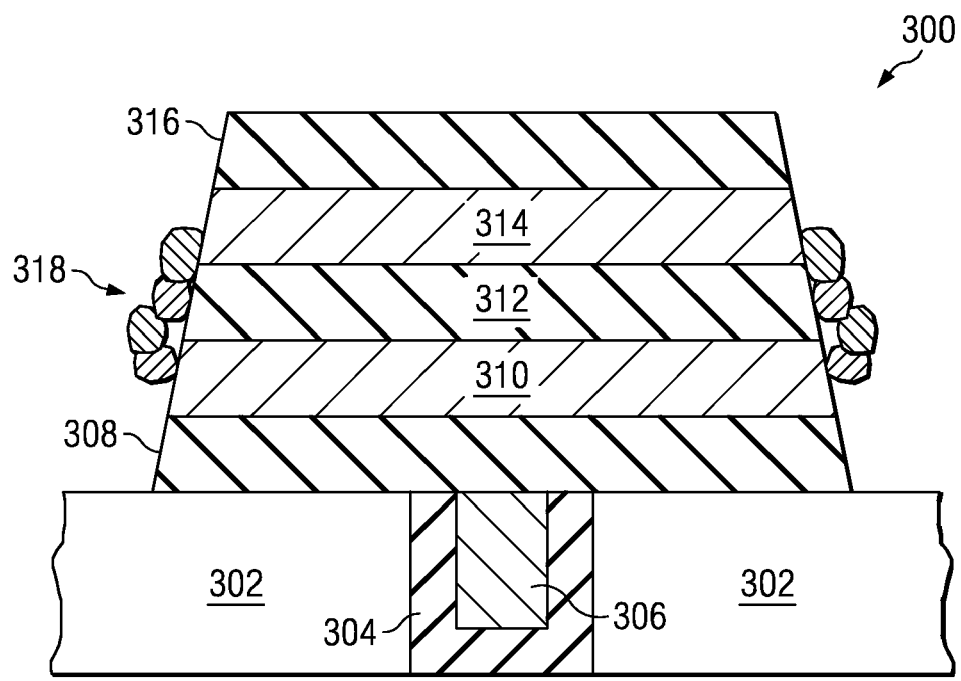
FIG. 3B is another view of the ferroelectric memory device of FIG. 3A.

FIG. 3B is another view of the ferroelectric memory device 300. Here, conductive residue 318 has attached to lateral edges of the ferroelectric stack. The conductive residue 318 can short or provide a low contact resistance path between the top electrode 314 and the bottom electrode 310. This condition is also referred to a bit clamping or clamped bits, particularly when cells are unreadable.

Conventional fabrication techniques tend to have a number of similarly degraded ferroelectric memory cells after fabrication. Typically, the defective cells are located on or near outer edges of an array.

Aspects of the present invention employ a dry clean operation during and/or after etching of the ferroelectric stack in order to mitigate degradation of ferroelectric devices, such as the device 300. The dry clean operation can, for example, remove the conductive residue 318 and prevent shorting of the top electrode 314 and the bottom electrode 310.

As a result, separation voltages can be more uniform across an array of ferroelectric memory cells. In particular, shrinkage of separation voltages for outer edge cells can be mitigated by performing the dry clean operation of aspects of the present invention.

FIG. 4 is a flow diagram illustrating a method 400 of fabricating a ferroelectric memory device in accordance with an aspect of the present invention. The method 400 employs a dry clean after etching of the ferroelectric stack in order to mitigate performance degradation and/or failure of ferroelectric memory cells.

It is appreciated that portions of the method 400 can be performed in an order varied from that introduced below. Additionally, other portions of the detailed description can be referenced for additional detail and support of the method 400. Furthermore, it is noted that processes in addition to those described can be employed in formation of the ferroelectric memory device and that some of the blocks below can be omitted in alternate aspects of the invention.

Beginning at block 402, an interlevel dielectric layer is formed on/over a semiconductor body or substrate and contacts are formed in the interlevel dielectric layer. The contacts are comprised of a conductive material, for example, tungsten (W) contacts, and are typically formed therein with a barrier layer, such as TiN, disposed there between to avoid oxidation of the contacts.

A bottom electrode diffusion barrier layer is formed over the interlayer dielectric at block 404. The diffusion barrier layer is electrically conductive and mitigates undesired diffusion from underlying layers there through. The diffusion barrier layer is comprised of a suitable diffusion blocking material, such as TiAlN, and the like. In one example, the diffusion barrier layer is formed as TiAlN by a physical vapor deposition process. It is noted that alternate aspects of the invention can omit the bottom electrode diffusion barrier layer.

A bottom electrode is then formed on/over the bottom electrode diffusion barrier layer at block 406. The bottom electrode is comprised of a conductive material, is typically stable in oxygen, and has a suitable thickness. Some other examples of possible materials that can be employed for the bottom electrode include, for example, a noble metal or conductive oxide such as iridium, iridium oxide, Pt, Pd, PdOx, Au, Ru, $RuO_x$, Rh, $RhO_x$, $LaSrCoO_3$, $(Ba,Sr)RuO_3$, $LaNiO_3$ or any stack or combination thereof. One example of a suitable thickness for the bottom electrode is around 30-100 nm thick. An example of a suitable deposition technique for the bottom electrode is sputter or reactive sputter deposition or chemical vapor deposition, however other deposition processes can be employed.

A ferroelectric layer is formed over the bottom electrode at block 408. The ferroelectric layer has a suitable thickness, for example about 50 to about 150 nm, and is comprised of a ferroelectric material. Some examples of suitable ferroelectric materials that can be employed in the ferroelectric layer include $Pb(Zr,Ti)O_3$ PZT (lead zirconate titanate), doped PZT with donors (Nb, La, Ta) acceptors (Mn, Co, Fe, Ni, Al) and/or both, PZT doped and alloyed with SrTiO3, BaTiO3 or CaTiO3, strontium bismuth tantalate (SBT) and other layered perovskites such as strontium bismuth niobate tantalate (SBNT) or bismuth titanate, BaTiO3, PbTiO3, Bi2TiO3, and the like. Generally, the ferroelectric material exhibits ferroelectric properties and has a suitable polarization and processing temperature.

One example of a suitable deposition process for the ferroelectric layer is metal organic chemical vapor deposition (MOCVD). MOCVD can be employed for thin films (<100 nm) and permits the film thickness to be scaled without significant degradation of switched polarization and coercive field, yielding, for example, PZT films with a low operating voltage and large polarization values. In addition, the reliability of the MOCVD formed ferroelectric layers is better than that generally obtained using other deposition techniques, particularly with respect to imprint/retention.

A top electrode is formed on/over the ferroelectric layer at block 410. The top electrode is comprised of a conductive material and has a suitable thickness. Some examples of suitable materials include Ir, $IrO_x$, noble metals, alloys thereof, and the like. Some examples of other suitable materials include Pt, Pd, PdOx, Au, Ru, $RuO_x$, Rh, $RhO_x$, $LaSrCoO_3$, $(Ba,Sr)RuO_3$, $LaNiO_3$ or any stack or combination thereof. One example of a suitable thickness for the top electrode is around 30-100 nm thick. An example of a suitable deposition technique for the top electrode is sputter or reactive sputter deposition or chemical vapor deposition, however other deposition processes can be employed.

Continuing, a hard mask is formed over the top electrode at block 412. The hard mask is comprised of a material, such as TiN, TiAlN, and the like. The hard mask can comprise one or more layers and is patterned so as to remain over a target stack region and expose other portions of the top electrode. It is noted that the hard mask can be removed at a later stage of fabrication or can remain in place, for example, to act as a diffusion barrier. As one example, photoresist can be employed to pattern deposited hard mask material to yield the hard mask over the target stack region.

The top electrode is etched at block 414 by a suitable etch process employing the hard mask for selectivity. The suitable etch process is selective to the hard mask material and the top electrode material. For noble metals, such as Ir, a suitable etch process is a high temperature etch chemical etch process. Such an etch process can permit relatively steep sidewall profiles etch selectivity to other layers such as the hard mask.

One exemplary etch chemistry for these noble metal electrodes is $Cl_2+O_2$ or $Cl_2+CO$. Other gas additives such as $N_2$ or Ar can also be added although Ar in particular is usually not a good choice because it only etches by physical mechanisms and not chemical. In one example, the top electrode etch is $Cl_2+O_2+N_2$. A suitable etch process can also use a high density plasma (1200 W, for example) and an intermediate substrate bias (300 W chuck) at intermediate pressures (10 mTorr) and elevated temperatures (350-400 C). In another example, BCl3 is employed with Ar at intermediate pressures at relatively low temperatures (about 60 degrees Celsius) for the etch.

The ferroelectric layer is etched at block 416 by a suitable etch process also employing the hard mask for selectivity. The suitable etch process is selective to the ferroelectric layer and the hard mask. In one example, a suitable etch process is based on a $Cl_2$+Fluorine gas+oxidizer ($O_2$ or CO for example) with Ar or $N_2$. For example, $Cl_2+O_2+CH_2F_2$ (75/35/12) at a high chuck temperature (350 C-400 C), at a medium pressure (10 mTorr), at a high density plasma (1200 W), and a large substrate bias (450 W RF on chuck). In another example, a suitable etch process for the ferroelectric layer is based on $Cl_2+O_2+CH_2F_3$ at a pressure of 10 mTorr, at a high density plasma (1200 W), and a large substrate bias (450 W), and at a temperature of about 150 degrees Celsius. It is appreciated that aspects of the present invention can include other suitable etch processes for the ferroelectric layer.

The bottom electrode is then etched at block 418 by a suitable etch process with the hard mask employed for selectivity. The suitable etch process is selective to the bottom electrode material and the hard mask material and can employ the same etch chemistry as used for etching the top electrode.

It is appreciated that a single etch process can be employed to etch the top electrode, the ferroelectric layer, and the bottom electrode.

The etching of the top electrode and the bottom electrode can result in re-deposition of electrode material and other low vapor pressure materials. If not removed, these re-deposited materials can degrade ferroelectric cell performance or even short the top and bottom electrodes.

The bottom electrode diffusion barrier layer is etched at block 420 by another suitable etch process. An ash process is typically performed after the etch of the bottom electrode diffusion barrier layer. In one example of a suitable ash process, the ash process employs $H_2O$—$O_2$ for a duration of 4 minutes.

A dry clean process is performed on the etched ferroelectric stack at block 422. The dry clean process removes, for example, contaminants such as re-deposited conductive material from the top and bottom electrodes. In one example, the dry clean process employs a $CF_4/O_2$ plasma, which generates isotropic fluoride species that slightly etches the ferroelectric layer (PZT) and reacts with other etch debris. It is appreciated that other suitable fluorine based plasmas can also be employed for the dry clean process.

In one example of a suitable dry clean process that mitigates edge degradation, the $CF_4$ is provided at 60 sccm, the $O_2$ is provided at 2940 sccm, for a duration of 60 seconds at a temperature of 60 degrees Celsius and at a power of 100 W. However, it is appreciated that other process conditions can be employed.

A wet etch/clean process is then performed at block 424. The wet etch/clean process includes an acid clean, such as phosphoric acid ($H_3PO_4$) and the like. The wet etch/clean process can be followed by an ash process. The phosphoric acid removes residual reaction products from the dry clean process. The ash process is an oxygen based process performed for a suitable duration and temperature. In one example, the suitable ash process is performed for a duration of about 3 minutes and at a temperature of about 325 degrees Celsius, however other durations and/or temperatures can be employed. Subsequently, sidewalls, such as aluminum oxide sidewalls, can be formed on lateral edges of the ferroelectric stack. Other fabrication processes can be performed to complete fabrication of the device.

FIG. 5 is a flow diagram illustrating a method 500 of fabricating a ferroelectric memory device in accordance with an aspect of the present invention. The method 500 employs a dry clean during etching of the ferroelectric stack in order to mitigate performance degradation and/or failure of ferroelectric memory cells, unlike the method 400 that employs a dry clean process after etching the ferroelectric stack. Portions of the method 500 are similar to portions of the method 400 described above and the discussion of the method 400 can be referenced for further information.

It is appreciated that portions of the method 400 can be performed in an order varied from that introduced below. Additionally, other portions of the detailed description can be referenced for additional detail and support of the method 500. Furthermore, it is noted that processes in addition to those described can be employed in formation of the ferroelectric memory device and that some of the blocks below can be omitted in alternate aspects of the invention.

Beginning at block 502, an interlevel dielectric layer is formed on/over a semiconductor body or substrate and contacts are formed in the interlevel dielectric layer. The contacts are comprised of a conductive material, for example, tungsten (W) contacts, and are typically formed therein with a barrier layer, such as TiN, disposed there between to avoid oxidation of the contacts.

A bottom electrode diffusion barrier layer is formed over the interlayer dielectric at block 504. The diffusion barrier layer is electrically conductive and mitigates undesired diffusion from underlying layers there through. The diffusion barrier layer is comprised of a suitable diffusion blocking material, such as TiAlN, and the like. It is noted that alternate aspects of the invention can omit the bottom electrode diffusion barrier layer.

A bottom electrode is then formed on/over the bottom electrode diffusion barrier layer at block 506. The bottom electrode is comprised of a conductive material, is typically stable in oxygen, and has a suitable thickness. Some other examples of possible materials that can be employed for the bottom electrode include, for example, a noble metal or conductive oxide such as iridium, iridium oxide, Pt, Pd, PdOx, Au, Ru, $RuO_x$, Rh, $RhO_x$, $LaSrCoO_3$, $(Ba,Sr)RuO_3$, $LaNiO_3$ or any stack or combination thereof.

A ferroelectric layer is formed over the bottom electrode at block 508. The ferroelectric layer has a suitable thickness, for example about 50 to about 150 nm, and is comprised of a ferroelectric material. Some examples of suitable ferroelectric materials that can be employed in the ferroelectric layer include $Pb(Zr,Ti)O_3$ PZT (lead zirconate titanate), doped PZT with donors (Nb, La, Ta) acceptors (Mn, Co, Fe, Ni, Al) and/or both, PZT doped and alloyed with $SrTiO3$, $BaTiO3$ or $CaTiO3$, strontium bismuth tantalate (SBT) and other layered perovskites such as strontium bismuth niobate tantalate (SBNT) or bismuth titanate, $BaTiO3$, $PbTiO3$, $Bi2TiO3$, and the like. Generally, the ferroelectric material exhibits ferroelectric properties and has a suitable polarization and processing temperature.

A top electrode is formed on/over the ferroelectric layer at block 510. The top electrode is comprised of a conductive material and has a suitable thickness. Some examples of suitable materials include Ir, $IrO_x$, noble metals, alloys thereof, and the like. Some examples of other suitable materials include Pt, Pd, PdOx, Au, Ru, $RuO_x$, Rh, $RhO_x$, $LaSrCoO_3$, $(Ba,Sr)RuO_3$, $LaNiO_3$ or any stack or combination thereof.

Continuing, a hard mask is formed over the top electrode at block 512. The hard mask is comprised of a material, such as TiN, TiAlN, and the like. The hard mask can comprise one or more layers. The hard mask is patterned so as to remain over a target stack region and expose other portions of the top electrode. It is noted that the hard mask can be removed at a later stage of fabrication or can remain in place, for example, to act as a diffusion barrier.

The top electrode is etched at block 514 by a suitable etch process employing the hard mask for selectivity. The suitable etch process is selective to the hard mask material and the top electrode material. For noble metals, such as Ir, an example of a suitable etch process is a high temperature chemical etch process.

The ferroelectric layer is etched at block 516 by a suitable etch process also employing the hard mask for selectivity. The suitable etch process is selective to the ferroelectric layer and the hard mask. In one example, a suitable etch process is based on a $Cl_2$+Fluorine gas+oxidizer ($O_2$ or CO for example) with Ar or $N_2$. For example, $Cl_2+O_2+CH_2F_2$ (75/35/12) at a high chuck temperature (350 C-400 C), at a medium pressure (10 mTorr), at a high density plasma (1200 W), and a large substrate bias (450 W RF on chuck). It is appreciated that aspects of the present invention can include other suitable etch processes for the ferroelectric layer.

The etching of the top electrode and the ferroelectric layer can result in re-deposition of electrode material and/or other materials. If not removed, these re-deposited materials can degrade ferroelectric cell performance.

A dry clean process is performed on the etched ferroelectric stack at block 518. The dry clean process removes, for example, contaminants and/or debris such as re-deposited conductive material from the top and bottom electrodes. In one example, the dry clean process employs a $CF_4/O_2$ plasma, which generates isotropic fluoride species that slightly etches the ferroelectric layer (PZT) and reacts with other etch debris.

In one example of a suitable dry clean process that mitigates edge degradation, the $CF_4$ is provided at 20 sccm, the $O_2$ is provided at 98 sccm, and Ar is provided at 20 sccm with a source power of 1400 W and a bias power of 450 W. However, it is appreciated that other process conditions can be employed.

The bottom electrode is then etched at block 520 with the hard mask employed for selectivity. A suitable etch process selective to the bottom electrode material and the hard mask material is employed. The etch process can employ the same etch chemistry as used for etching the top electrode.

The bottom electrode diffusion barrier layer is etched at block 522 by another suitable etch process. An ash process is typically performed after the etch of the bottom electrode diffusion barrier layer. In one example of a suitable ash process, the ash process employs $H_2O$—$O_2$ for a duration of 5 minutes.

A wet etch/clean process is then performed at block 524. The wet etch/clean process includes an acid clean and can be followed by an ash process. As an example, phosphoric acid can remove residual reaction products from the dry clean process. The ash process is an oxygen based process, in one example, performed for a duration of about 3 minutes and at a temperature of about 450 to about 550 degrees Celsius. Subsequently, sidewalls, such as aluminum oxide sidewalls, can be formed on lateral edges of the ferroelectric stack. Other fabrication processes can be performed to complete fabrication of the device.

It is appreciated that variations of the method 500 are contemplated in accordance with the present invention. For example, a second dry clean could also be performed after etching the bottom electrode and/or the diffusion barrier in addition to the dry clean performed at block 518.

FIGS. 6A to 6E depict a ferroelectric memory device at various stages of fabrication in accordance with an aspect of the present invention. The method 400 of FIG. 4, the method 500 of FIG. 5, and/or variations thereof can be employed to fabricate the device. The ferroelectric memory device is provided as an example for illustrative purposes. It is appreciated that other ferroelectric memory devices can be fabricated in accordance with the present invention.

Figure 6A:
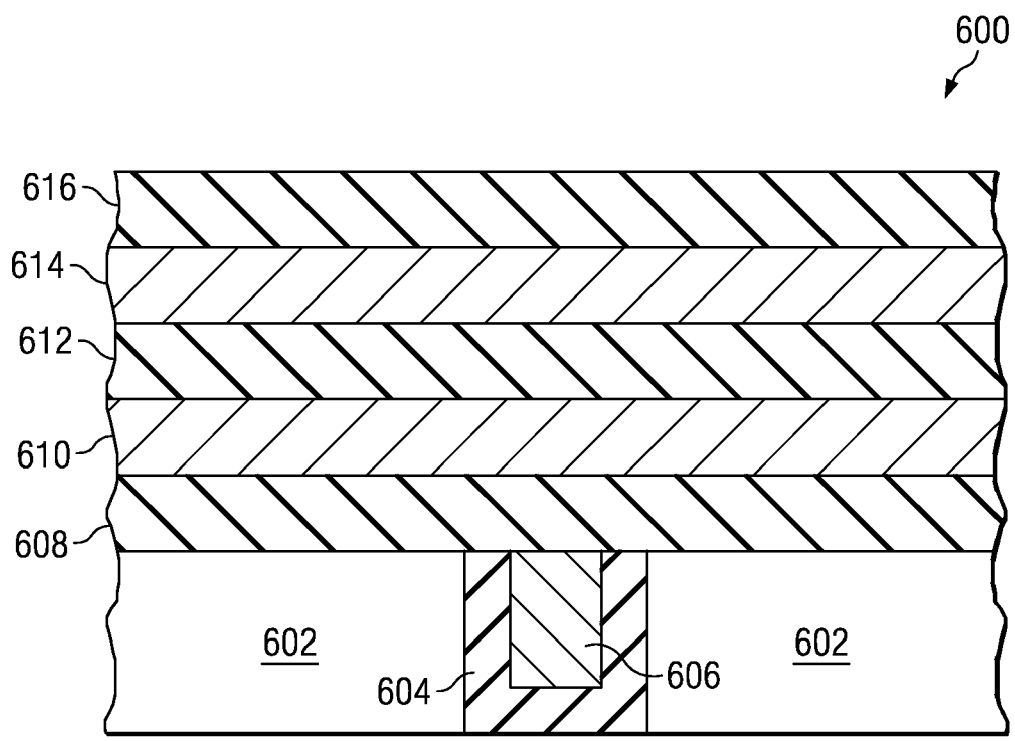
FIG. 6A is a cross sectional view of a ferroelectric memory device at a stage of fabrication in accordance with an aspect of the present.

Turning now to FIG. 6A, a cross sectional view of a ferroelectric memory device 600 at a stage of fabrication in accordance with an aspect of the present invention is provided. The memory device 600 is depicted prior to etching the ferroelectric stack.

The memory device 600 includes one or more semiconductor layers 602, such as a dielectric layer, interlevel dielectric layer, interlayer dielectric layer, silicon layer, and the like. A contact barrier layer 604 and a contact 606 are typically formed within the layers 602. In one example, the contact 606 is comprised of tungsten.

A bottom electrode diffusion barrier layer 608 is formed over/on the one or more semiconductor layers 602. The diffusion barrier layer 608 is comprised of a suitable diffusion blocking material, such as TiAlN and the like. The diffusion barrier layer 608 is also comprised of conductive material. It is noted that devices formed in accordance with aspects of the present invention do not necessarily require a bottom electrode diffusion barrier layer.

A bottom electrode 610 is formed on the bottom electrode diffusion barrier layer 608. The bottom electrode 610 is comprised of a suitable conductive material, such as iridium, iridium oxide, other noble metals, and the like and has a suitable thickness.

A ferroelectric layer 612 is formed on the bottom electrode 610. The ferroelectric layer 612 is comprised of a ferroelectric material, such as PZT, that exhibits ferroelectric properties. Such materials include suitable polarization characteristics and processing temperature.

A top electrode 614 is formed on the ferroelectric layer 612. The top electrode 614 is also comprised of a suitable conductive material, such as iridium, iridium oxide, other noble metals, and the like and has a suitable thickness.

A hard mask layer 616 is formed on the top electrode 614. The hard mask layer 616 facilitates etching of the ferroelectric stack and can also be a diffusion barrier, for example, by blocking hydrogen. Some examples of suitable materials for the hard mask layer 616 include TiN, TiAlN, and the like.

Figure 6B:
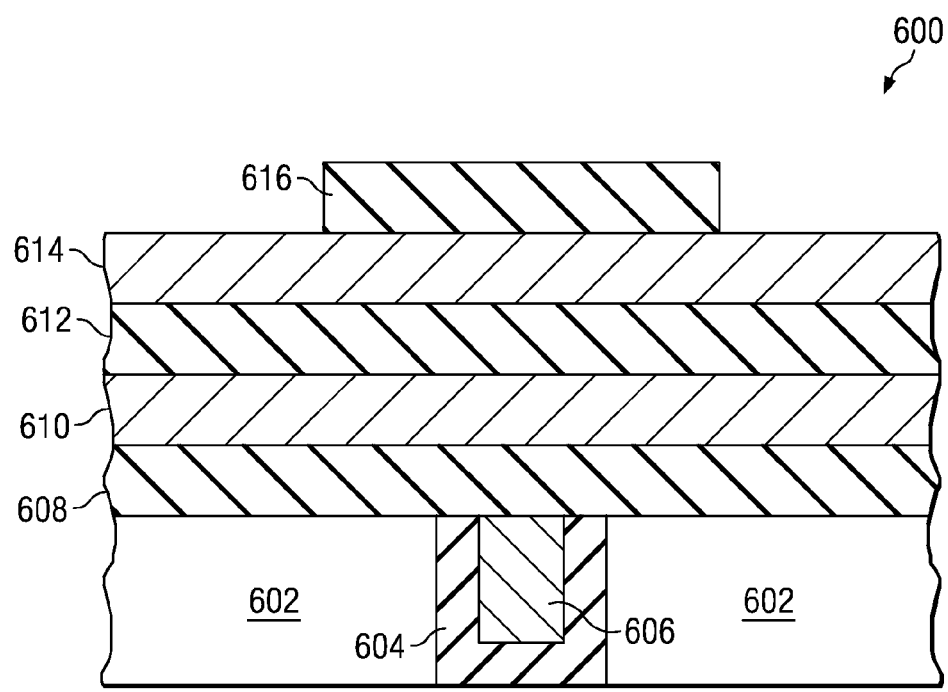
FIG. 6B is another cross sectional view of a ferroelectric memory device at a stage of fabrication in accordance with an aspect of the present invention is provided.

Turning now to FIG. 6B, another cross sectional view of a ferroelectric memory device 600 at a stage of fabrication in accordance with an aspect of the present invention is provided. The hard mask layer 616 has been patterned so as to expose portions of the underlying layers while covering a target ferroelectric stack portion. In one example, a photoresist patterning process is employed to define the hard mask layer 616.

Figure 6C:
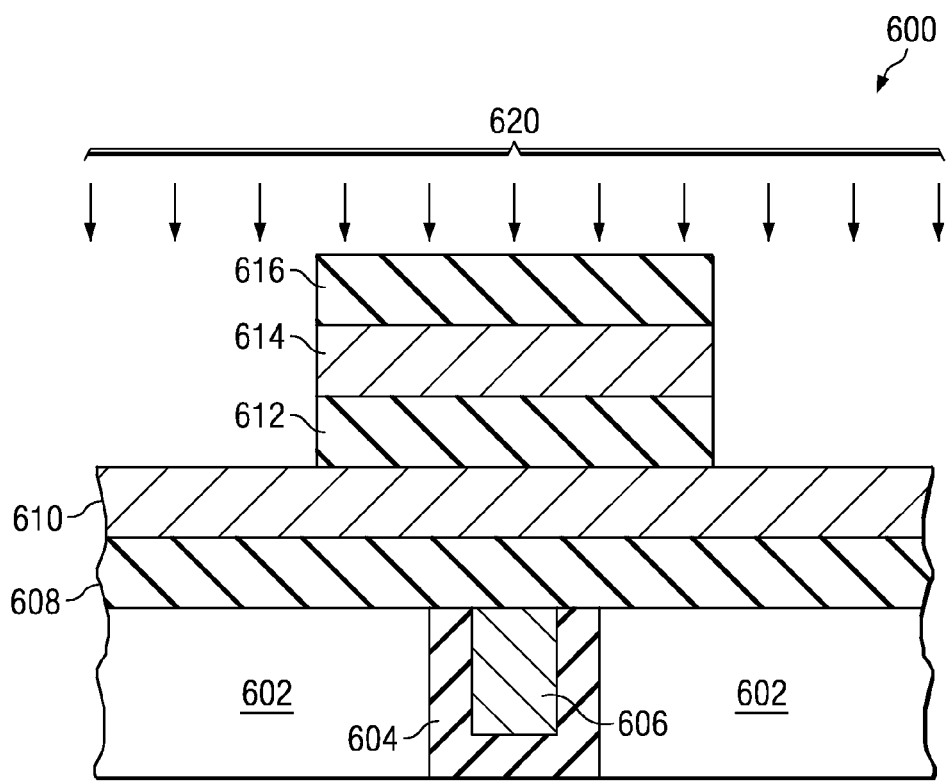
FIG. 6C is yet another cross section view of a ferroelectric memory device at a stage of fabrication in accordance with an aspect of the present invention.

FIG. 6C shows yet another cross section view of the ferroelectric memory device 600 at a stage of fabrication in accordance with an aspect of the present invention. Here, the ferroelectric stack has been partially etched.

One or more etch processes have been employed to selectively etch the top electrode 614 and the ferroelectric layer 612, as described above. Thereafter, a dry clean 620 is performed to mitigate edge defects. The dry clean 620 can remove contaminants and/or debris, such as re-deposited or displaced conductive or ferroelectric materials. In one example, the dry clean 620 employs a $CF_4/O_2$ plasma, which generates isotropic fluoride species that slightly etches the ferroelectric layer and reacts with other etch debris.

Figure 6D:
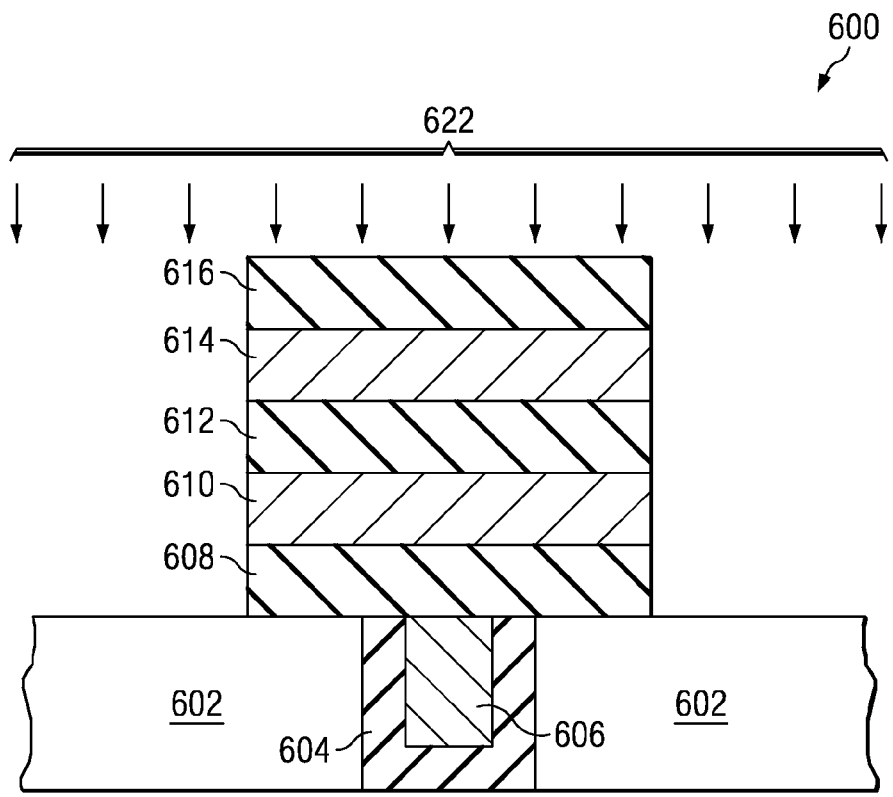
FIG. 6D is another cross section view of a ferroelectric memory device at a stage of fabrication in accordance with an aspect of the present invention.

FIG. 6D depicts another cross section view of the ferroelectric memory device at a stage of fabrication in accordance with an aspect of the present invention. At this stage, the ferroelectric stack has been etched. One or more suitable etch processes are employed to selectively remove portions of the bottom electrode layer 610 and the bottom electrode diffusion layer 608.

Again, a dry clean 622 is performed to mitigate edge defects. The dry clean 622 can remove contaminants and/or debris, such as re-deposited or displaced conductive materials from the top electrode 614, the bottom electrode 610, and the bottom electrode diffusion barrier layer 608 or ferroelectric materials from the ferroelectric layer 612. In one example, the dry clean 622 employs a CF4/O2 plasma, which generates isotropic fluoride species that slightly etches the ferroelectric layer and reacts with other etch debris.

It is noted that ferroelectric memory devices formed in accordance with aspects of the present invention can employ one or both of the dry clean processes 620 and 622.

Figure 6E:
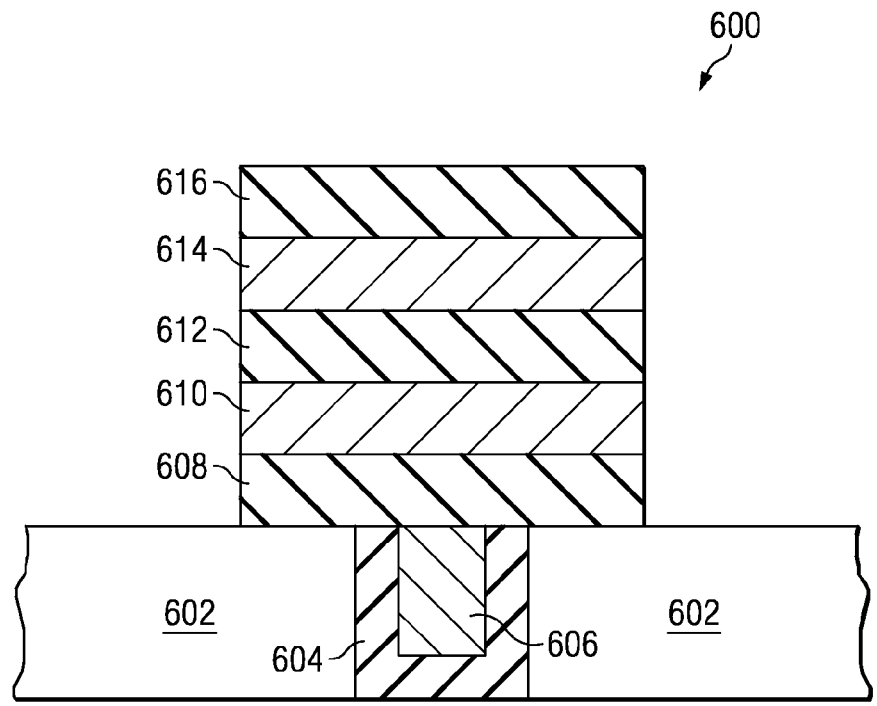
FIG. 6E is yet another cross section view of a ferroelectric memory device at a stage of fabrication in accordance with an aspect of the present invention.

FIG. 6E illustrates yet another cross section view of the ferroelectric memory device at a stage of fabrication in accordance with an aspect of the present invention. A wet etch process and a ash process can be performed to facilitate removal of debris or contaminants. For example, a phosphoric acid can be employed as a wet etch/clean process to remove residual reaction products from the dry clean processes 620 and 622.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Also, the term "exemplary" is intended as an example, not as a best or superior solution. Furthermore, to the extent that the term "includes" is used in either the detailed description or the claims, such term is intended to be inclusive in a manner similar to the term "comprising."

What is claimed is:

1. A method of fabricating a ferroelectric memory device, the method comprising:
    forming a bottom electrode over one or more semiconductor layers;
    forming a ferroelectric layer over the bottom electrode;
    forming a top electrode over the ferroelectric layer;
    selectively etching the top electrode;
    selectively etching the ferroelectric layer;
    performing a dry clean process subsequent to etching the ferroelectric layer with a plasma that generates isotropic fluoride species that react with debris to form residual reaction products; and
    selectively etching the bottom electrode subsequent to performing the dry clean process.

2. The method of claim 1, further comprising performing a wet clean process with phosphoric acid to remove the residual reaction products subsequent to performing the dry clean process.

3. The method of claim 1, further comprising forming a bottom electrode diffusion barrier layer over one or more semiconductor layers prior to forming the bottom electrode.

4. The method of claim 1, further comprising forming a hard mask on the top electrode covering a target portion of the top electrode prior to etching the top electrode.

5. The method of claim 1, further comprising performing a second dry clean subsequent to selectively etching the bottom electrode diffusion barrier layer.

6. The method of claim 1, wherein the plasma is comprised of $CF_4/O_2$.

7. The method of claim 1, wherein the plasma is comprised of $CF_4/O_2/Ar$.

* * * * *